(12) United States Patent
Ikemoto et al.

(10) Patent No.: US 9,854,685 B2
(45) Date of Patent: Dec. 26, 2017

(54) ELECTRONIC COMPONENT, METHOD FOR MANUFACTURING THE ELECTRONIC COMPONENT, AND CIRCUIT BOARD

(71) Applicant: Murata Manufacturing Co., Ltd., Nagaokakyo-shi, Kyoto-fu (JP)

(72) Inventors: Nobuo Ikemoto, Nagaokakyo (JP); Makoto Osamura, Nagaokakyo (JP); Satoshi Sasaki, Nagaokakyo (JP); Yuki Wakabayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 138 days.

(21) Appl. No.: 14/838,562

(22) Filed: Aug. 28, 2015

(65) Prior Publication Data

US 2015/0373854 A1 Dec. 24, 2015

Related U.S. Application Data

(63) Continuation of application No. PCT/JP2014/056840, filed on Mar. 14, 2014.

(30) Foreign Application Priority Data

Apr. 26, 2013 (JP) ................. 2013-093506

(51) Int. Cl.
*H05K 7/10* (2006.01)
*H05K 7/12* (2006.01)
(Continued)

(52) U.S. Cl.
CPC ............. *H05K 3/301* (2013.01); *H01L 24/81* (2013.01); *H01L 27/14618* (2013.01);
(Continued)

(58) Field of Classification Search
CPC . H01L 2924/00014; H01L 2224/13144; H01L 2224/81444; H01L 2224/81801;
(Continued)

(56) References Cited

U.S. PATENT DOCUMENTS

| 7,271,495 B2 * | 9/2007 | Prengel ............. H01L 23/49816 257/774 |
| 2004/0069998 A1 * | 4/2004 | Harazono ......... H01L 27/14618 257/81 |

(Continued)

FOREIGN PATENT DOCUMENTS

| JP | 2002-299651 A | 10/2002 |
| JP | 2004-273777 A | 9/2004 |
| JP | 2006-120683 A | 5/2006 |

OTHER PUBLICATIONS

Official Communication issued in International Patent Application No. PCT/JP2014/058840, dated May 20, 2014.

*Primary Examiner* — Yuriy Semenenko
(74) *Attorney, Agent, or Firm* — Keating & Bennett, LLP

(57) ABSTRACT

A camera module includes an image sensor IC including terminal electrodes, and a circuit board on which the image sensor IC is mounted. The circuit board includes mount electrodes to which the terminal electrodes are ultrasonically welded, a flat film member provided with the mount electrodes, and a base member to which the flat film member is bonded. An elastic modulus of the flat film member is higher than that of the base member.

13 Claims, 8 Drawing Sheets

(51) Int. Cl.
- *H05K 3/30* (2006.01)
- *H01L 27/146* (2006.01)
- *H05K 1/18* (2006.01)
- *H05K 3/46* (2006.01)
- *H04N 5/225* (2006.01)
- *H05K 1/02* (2006.01)
- *H05K 1/11* (2006.01)
- *H05K 3/32* (2006.01)
- *H01L 23/00* (2006.01)
- *H05K 3/40* (2006.01)

(52) U.S. Cl.
CPC ........... *H04N 5/225* (2013.01); *H04N 5/2254* (2013.01); *H04N 5/2257* (2013.01); *H05K 1/0296* (2013.01); *H05K 1/113* (2013.01); *H05K 1/181* (2013.01); *H05K 1/184* (2013.01); *H05K 3/328* (2013.01); *H05K 3/4617* (2013.01); *H01L 24/13* (2013.01); *H01L 24/16* (2013.01); *H01L 2224/13144* (2013.01); *H01L 2224/81205* (2013.01); *H01L 2224/81444* (2013.01); *H01L 2224/81801* (2013.01); *H01L 2924/15151* (2013.01); *H01L 2924/15153* (2013.01); *H01L 2924/15159* (2013.01); *H01L 2924/15162* (2013.01); *H01L 2924/15787* (2013.01); *H05K 1/186* (2013.01); *H05K 3/403* (2013.01); *H05K 2201/09036* (2013.01); *H05K 2201/09454* (2013.01); *H05K 2201/10121* (2013.01); *H05K 2201/10151* (2013.01); *H05K 2203/0285* (2013.01); *H05K 2203/063* (2013.01); *Y10T 29/49146* (2015.01)

(58) Field of Classification Search
CPC ....... H01L 2924/15787; H01L 2924/00; H01L 2924/00012; H01L 2224/81205; H01L 24/13; H01L 24/16; H01L 24/81; H01L 27/14618

See application file for complete search history.

(56) References Cited

U.S. PATENT DOCUMENTS

| | | | |
|---|---|---|---|
| 2004/0178486 A1* | 9/2004 | Maeda | H01L 24/81 257/678 |
| 2010/0276187 A1* | 11/2010 | Nakamura | H05K 3/4069 174/258 |
| 2014/0055651 A1* | 2/2014 | Chen | H04N 5/335 348/294 |

* cited by examiner

ELECTRONIC COMPONENT, METHOD FOR MANUFACTURING THE ELECTRONIC COMPONENT, AND CIRCUIT BOARD

BACKGROUND OF THE INVENTION

1. Field of the Invention

The present invention relates to a technique for mounting a surface mount element on a circuit board. In particular, the present invention relates to an electronic component having a surface mount element mounted on a circuit board using an ultrasonic welding method, a method for manufacturing the electronic component, and a circuit board.

2. Description of the Related Art

A flexible multilayer resin substrate may be used as a circuit board. For example, such a circuit board having a multilayer structure is formed by thermally softening and press-bonding a plurality of layers of thermoplastic resin, such as liquid crystal polymer resin.

Examples of methods for mounting a surface mount element on such a circuit board include an ultrasonic welding method (see, e.g., Japanese Unexamined Patent Application Publication No. 2006-120683). FIG. 7 is a schematic diagram illustrating an ultrasonic welding method described in Japanese Unexamined Patent Application Publication No. 2006-120683.

The ultrasonic welding method is a technique in which terminal electrodes (not shown) of a surface mount element 103 are welded to mount electrodes (not shown) of a circuit board 101 by frictional heat generated on the contact surfaces by ultrasonically vibrating the surface mount element 103 which is in contact with the circuit board 101. In the technique described in Japanese Unexamined Patent Application Publication No. 2006-120683, a liquid crystal polymer resin is adopted as a material of the circuit board 101. The liquid crystal polymer resin has a crystal orientation, and its elastic modulus along the crystal orientation is greater than those along other orientations. Therefore, if the direction in which the surface mount element 103 is ultrasonically vibrated is not along the crystal orientation of the liquid crystal polymer resin in the circuit board 101, the ultrasonic vibration may be absorbed in the circuit board 101 and the bonding strength of the surface mount element 103 may be lowered. In the technique described in Japanese Unexamined Patent Application Publication No. 2006-120683, the direction in which the surface mount element 103 is ultrasonically vibrated is aligned with the crystal orientation of the liquid crystal polymer resin in the circuit board 101, so as to stabilize the bonding strength of the surface mount element 103 to the circuit board 101.

In the ultrasonic welding method, as described above, the surface mount element may not be bonded to the circuit board with a sufficient bonding strength, due to absorption of ultrasonic vibration in the circuit board. In particular, if the circuit board is made of a soft material, such as liquid crystal polymer, the vibrational energy of the ultrasonic vibration is not easily transmitted and it is not easy to stabilize the bonding. As a result, for example, if the circuit board is bent, the surface mount element may fall off the circuit board or poor contact of the surface mount element may occur.

In particular, if the circuit board is made of a thermoplastic material, such as liquid crystal polymer, frictional heat may locally soften the circuit board and may cause the surface of the circuit board to cave in. Thus, sufficient pressure may not be applied to the surface mount element, and the bonding strength may be weakened. To stably achieve a sufficient bonding strength when the circuit board is made of a material having a crystal orientation, it is necessary to determine the crystal orientation in the circuit board and appropriately set the direction of ultrasonic vibration. This may increase the degree of difficulty of the mounting process.

SUMMARY OF THE INVENTION

Preferred embodiments of the present invention provide an electronic component, a method for manufacturing the electronic component, and a circuit board in which, when a surface mount element is mounted on the circuit board using an ultrasonic welding method, a sufficient bonding strength is reliably achieved. For example, even if the circuit board is bent, it is possible to significantly reduce or prevent falling and poor contact of the surface mount element.

An electronic component according to an aspect of various preferred embodiments of the present invention includes a surface mount element including a terminal electrode, and a circuit board on which the surface mount element is mounted. The circuit board includes a mount electrode to which the terminal electrode is ultrasonically welded, a flat film member including the mount electrode, and a base member to which the flat film member is bonded. An elastic modulus of the flat film member is higher than an elastic modulus of the base member.

A circuit board according to another aspect of various preferred embodiments of the present invention includes a mount electrode, a flat film member including the mount electrode, and a base member to which the flat film member is bonded. An elastic modulus of the flat film member is higher than an elastic modulus of the base member.

A method for manufacturing the electronic component according to another aspect of various preferred embodiments of the present invention includes placing the surface mount element on the flat film member included in the circuit board, and ultrasonically welding the terminal electrode to the mount electrode.

In the above-described aspects of various preferred embodiments of the present invention, when an ultrasonic welding method is used to mount the surface mount element on the circuit board, the surface mount element is mounted on the circuit board, with the flat film member having a higher elastic modulus interposed therebetween. This makes it possible to significantly reduce the amount of ultrasonic vibration transmitted from the surface mount element through the flat film member to the base member and absorbed in the base member, so that the surface mount element is mounted on the circuit board with a sufficient bonding strength.

Additionally, a load applied to the surface mount element is supported by the flat film member. Therefore, even when the base member is made of a thermoplastic resin, the circuit board is prevented from locally softening by frictional heat and caving in on the surface thereof. This stabilizes the bonding strength between the surface mount element and the circuit board.

Additionally, even when the base member is made of a liquid crystal polymer resin, the surface mount element is able to be bonded to the circuit board without being affected by the crystal orientation of the base member. It is thus possible to simplify the step of mounting the surface mount element and reliably stabilize the bonding strength.

The electronic component and the circuit board described above may include a via hole conductor provided in one of the base member and the flat film member, and a pad conductor provided in the other of the base member and the flat film member. The via hole conductor may be directly bonded to the pad conductor, and the mount electrode may be electrically connected to the base member through the via hole conductor and the pad conductor. Bonding the via hole conductor to the pad conductor as described above enhances the bonding strength of the flat film member with respect to the base member. Also, with this configuration, the manufacturing process is made simpler than the case where pad conductors are provided on both the base member and the flat film member and bonded together.

The base member may include a recessed portion and a raised portion in one principal surface thereof. The flat film member may be bonded to the base member, with an end portion thereof embedded in the raised portion and the mount electrode exposed from the recessed portion. Thus, embedding the end portion of the flat film member in the raised portion enhances the bonding strength of the flat film member with respect to the base member.

In the electronic component and the circuit board described above, the flat film member may include a pad conductor in a surface thereof where the mount electrode is provided, the pad conductor may be embedded in the raised portion, and the mount electrode may be electrically connected to the base member through the pad conductor. With this configuration, the circuit board is preferably formed by providing a conductive pattern on only one principal surface of the flat film member. Thus, the manufacturing process is further simplified.

The flat film member may have a dielectric constant different from that of the base member, and may be provided with a functional conductor defining a high-frequency component. The flat film member may have magnetic permeability different from that of the base member, and may be provided with a functional conductor defining a magnetic component. Thus, using the flat film member makes it possible to achieve good high-frequency characteristics or provide a small magnetic component.

In the above-described aspects of various preferred embodiments of the present invention, the surface mount element is mounted on the circuit board, with the flat film member having a higher elastic modulus than the base member interposed therebetween. Thus, even though an ultrasonic welding method is used to mount the surface mount element on the circuit board, ultrasonic vibration from the surface mount element is not easily absorbed in the circuit board, and the surface mount element is able to be mounted on the circuit board with a sufficient bonding strength. Therefore, it is possible to prevent the surface mount element from easily falling off the circuit board, and also possible to reduce the occurrence of poor contact.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component, a method for manufacturing the electronic component, and a circuit board according to preferred embodiments of the present invention will now be described. Here, a camera module is used as a non-limiting example of the electronic component. Each of the drawings used in the following description does not show all conductive patterns and circuit elements, and shows features of various preferred embodiments of the present invention.

Figure 1A:
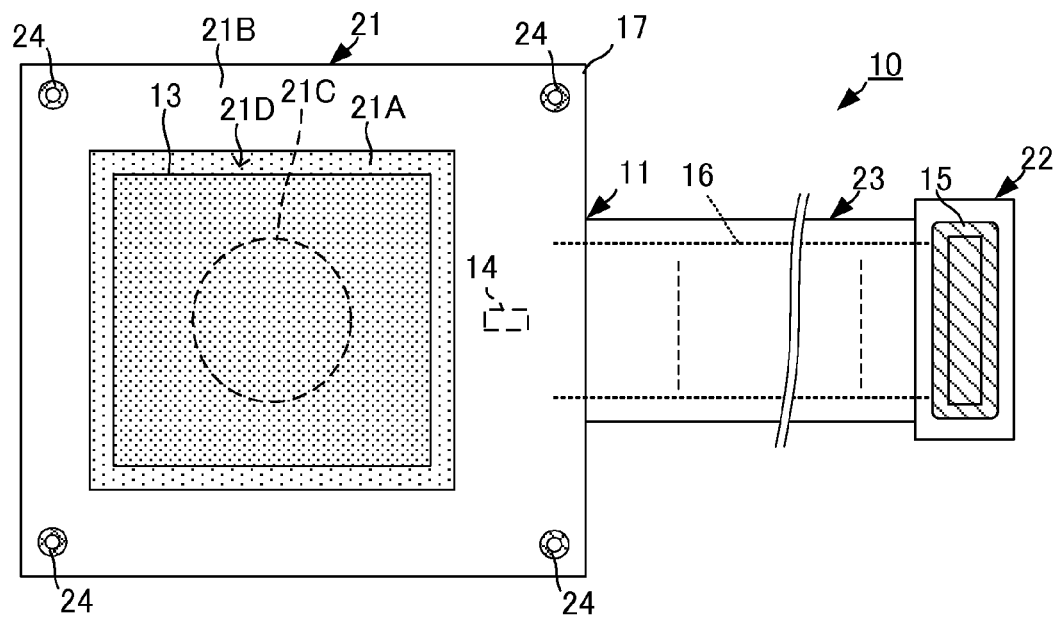
FIG. 1A is a plan view of an electronic component according to a first preferred embodiment of the present invention as viewed from one principal surface thereof.
Figure 1B:
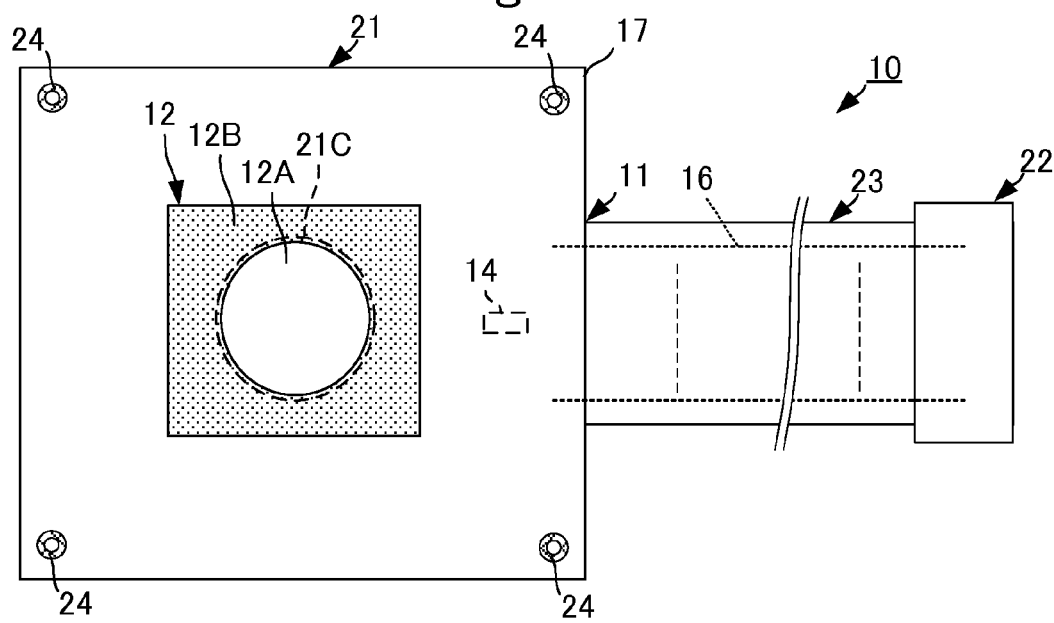
FIG. 1B is a plan view of the electronic component as viewed from the other principal surface thereof.
Figure 2:
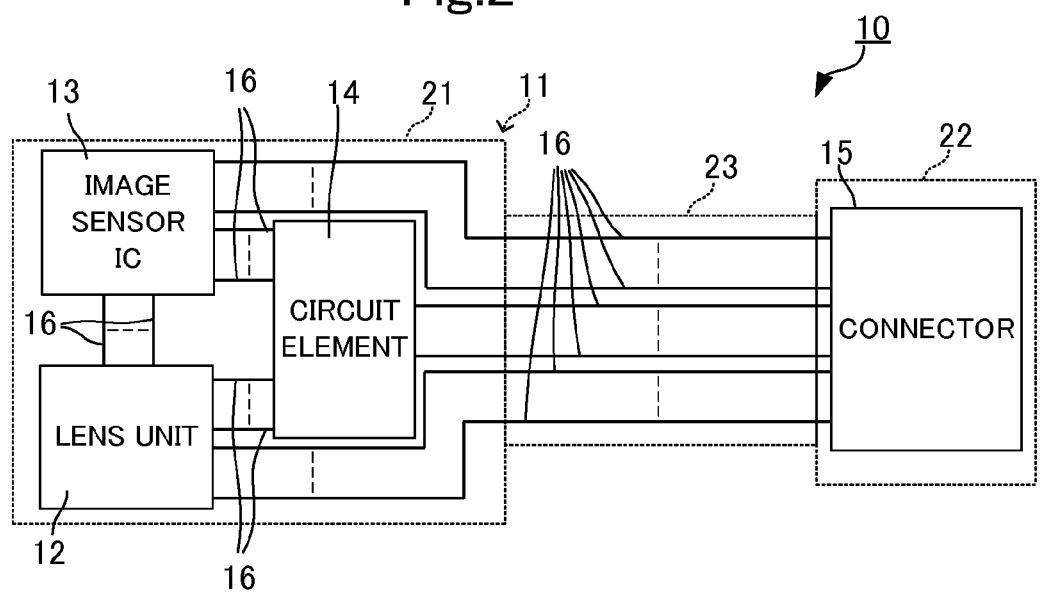
FIG. 2 is a functional block diagram of the electronic component according to the first preferred embodiment of the present invention.

A general configuration of a camera module 10 according to a first preferred embodiment of the present invention will be described. FIG. 1A is a plan view of the camera module 10 as viewed from one principal surface thereof. FIG. 1B is a plan view of the camera module 10 as viewed from the other principal surface thereof. FIG. 2 is a functional block diagram of the camera module 10.

The camera module 10 includes a circuit board 11, a lens unit 12, an image sensor integrated circuit (IC) 13, a circuit element 14, a connector 15, and a wiring portion 16.

The circuit board 11 includes a base member 17 made of a liquid crystal polymer resin. The liquid crystal polymer resin is a highly flexible material, and this provides overall flexibility of the base member 17. The liquid crystal polymer resin is a thermoplastic material, and the base member 17 has the property of softening as the temperature increases. The base member 17 is a laminated member formed by applying heat and pressure to liquid crystal polymer resin sheets oriented in one or two axial directions. Thus, the base member 17 has a crystal orientation, and has elastic modulus anisotropy in the direction along its surface. The base member 17 may be made of a material other than the liquid crystal polymer resin, such as polyimide having thermoplasticity. However, it is preferable that the base member 17 be a laminated member that is preferably formed by applying heat and pressure to liquid crystal polymer resin sheets, because of higher water resistance and less variation in dielectric constant and dimensions during water absorption than the base member 17 made of polyimide. When a thermoplastic resin is used to form the base member 17, a laminated body is easily formed by thermal pressure bonding. However, since the base member 17 made of a thermoplastic resin is prone to be deformed by reheating, an ultrasonic welding method which allows local generation of frictional heat is used to mount various components. With the ultrasonic welding method, the base member 17 made of a thermoplastic resin is prevented from being heated over a wide area. In the camera module 10, the occurrence of deformation in a light path near the image sensor IC 13 may cause a critical failure. When the ultrasonic welding method is used to mount various components on the base member 17 made of a thermoplastic resin, it is possible to reduce deformation in the light path and prevent image disturbance caused, for example, by undesired reflection in the light path.

The base member 17 includes mounting portions 21 and 22 and a connecting portion 23. The mounting portions 21 and 22 and the connecting portion 23 are preferably configured to define an integral unit. The mounting portion 21 preferably has a quadrangular or substantially quadrangular planar shape in plan view, as viewed from one principal surface in the thickness direction. The mounting portion 21 is connected to one end of the connecting portion 23. The mounting portion 22 preferably has a rectangular or substantially rectangular planar shape smaller in size than the mounting portion 21 in plan view, as viewed from the one principal surface in the thickness direction. The mounting portion 22 is connected to the other end of the connecting portion 23. The connecting portion 23 is in the shape of a flat cable. The connecting portion 23 is narrower in width than the mounting portions 21 and 22 in plan view, as viewed from the one principal surface in the thickness direction. The connecting portion 23 extends longitudinally in the direction connecting the mounting portion 21 and the mounting portion 22. The connecting portion 23 is thinner than the mounting portions 21 and 22. This ensures the flexibility of the connecting portion 23 while improving the strength (rigidity) of the mounting portions 21 and 22. Both principal surfaces of the mounting portions 21 and 22 and the connecting portion 23 are appropriately provided with an insulating resist film (not shown).

The mounting portion 21 includes a recessed portion 21A and a raised portion 21B. The recessed portion 21A is recessed from the raised portion 21B as viewed from the one principal surface of the mounting portion 21. The recessed portion 21A is located in the center of the mounting portion 21. The raised portion 21B surrounds the recessed portion 21A in the mounting portion 21. This creates a cavity space 21D surrounded by the raised portion 21B on the one principal surface side of the recessed portion 21A. The cavity space 21D contains the image sensor IC 13. A through hole 21C is provided in the center of the recessed portion 21A. The lens unit 12 is disposed on the other principal surface of the mounting portion 21 to cover the through hole 21C. The through hole 21C defines a light path that optically connects the lens unit 12 and the image sensor IC 13. Through holes 24 are provided near the four corners of the raised portion 21B. The through holes 24 are used to fix to an external device. Although not shown, the recessed portion 21A may be covered with a planar cover member provided on the one principal surface side to block light from reaching the image sensor IC 13. With this configuration, it is possible to block undesired light and achieve good optical characteristics in the camera module 10.

The lens unit 12 includes a lens 12A and a lens driving portion 12B. The lens 12A is positioned such that the optical axis coincides with the center of the opening of the through hole 21C. The lens 12A is configured to guide (concentrating) light incident from the outside to the through hole 21C. The lens driving portion 12B holds the lens 12A. The lens driving portion 12B is configured to vary the position of the lens 12A in the height direction and adjust the focus of the lens 12A in accordance with a control signal input from the image sensor IC 13 or the connector 15 through the wiring portion 16.

The image sensor IC 13 corresponds to a surface mount element. The image sensor IC 13 is positioned in the cavity space 21D to cover the through hole 21C on one principal surface (inner bottom) of the recessed portion 21A. The image sensor IC 13 includes a light receiving surface facing the one principal surface (inner bottom) of the recessed portion 21A. The image sensor IC 13 is configured to receive light incident from the lens unit 12 through the through hole 21C and picking up an image. The image sensor IC 13 also is configured to receive a control signal input from an external circuit through the connector 15 and the wiring portion 16 and output image data to the external circuit through the wiring portion 16 and the connector 15.

The wiring portion 16 is disposed on the surface of and inside the circuit board 11. The wiring portion 16 extends from the mounting portion 21 through the connecting portion 23 to the mounting portion 22. As illustrated in FIG. 2, the wiring portion 16 allows the lens unit 12, the image sensor IC 13, the circuit element 14, and the connector 15 to connect to one another. The wiring portion 16 has high connection reliability because it is provided in the base member 17 which includes the mounting portions 21 and 22 and the connecting portion 23 configured as an integral unit.

The circuit element 14 is embedded in the mounting portion 21. A passive element, such as a capacitor element, an inductor element, a resistance element, or a filter element, is provided as the circuit element 14 appropriately depending on the circuit configuration. The circuit element 14 may be disposed on a surface of the circuit board 11. The circuit element 14 may be an active element (e.g., IC), except the image sensor IC 13. More than one circuit element 14 may be provided. The circuit element 14 may be defined by conductors disposed on the surface of and inside the circuit board 11.

The connector 15 is disposed on one principal surface of the mounting portion 22. The connector 15 defines a connection terminal for connection to an external circuit, such as an external substrate. The connector 15 may be disposed on the other principal surface side of the circuit board 11.

Figure 3:
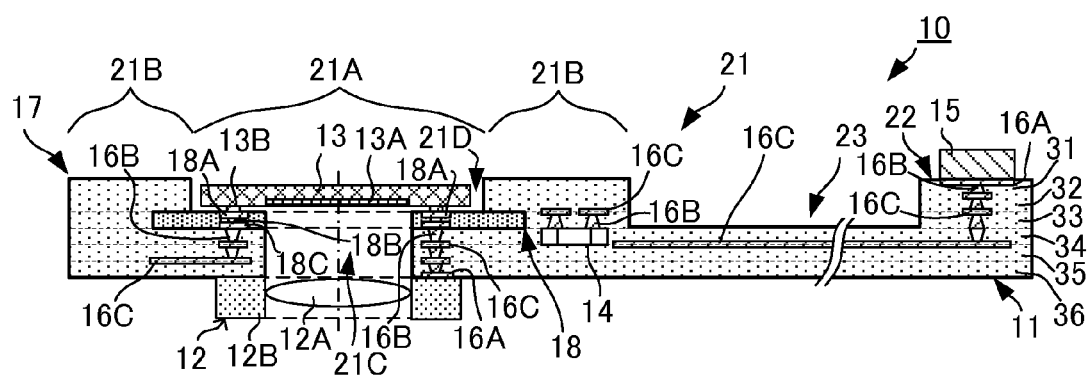
FIG. 3 is a lateral cross-sectional view of the electronic component according to the first preferred embodiment of the present invention.

FIG. 3 is a lateral cross-sectional view of the camera module 10.

The base member 17 is formed preferably by stacking resin layers 31, 32, 33, 34, 35, and 36 sequentially from one principal surface side to the other principal surface side. The recessed portion 21A of the mounting portion 21 is formed preferably by stacking the resin layers 34 to 36, whereas the raised portion 21B of the mounting portion 21 is formed preferably by stacking the resin layers 31 to 36. The connecting portion 23 is formed preferably by stacking the resin layers 34 to 36. The mounting portion 22 is formed preferably by stacking the resin layers 31 to 36.

The wiring portion 16 is formed preferably by electrically connecting mount electrodes 16A, via hole conductors 16B, and inner conductive traces 16C. The inner conductive traces 16C are disposed on interfaces between the resin layers 31 to 36. The via hole conductors 16B pass through the resin layers 31 to 36. The mount electrodes 16A are disposed on the other principal surface of the mounting portion and the one principal surface of the mounting portion 22. The lens unit 12 and the connector 15 are mounted on the corresponding mount electrodes 16A, with a metal bump or an anisotropic conductive sheet interposed therebetween.

The image sensor IC 13 includes a light receiving region 13A in the light receiving surface facing the circuit board 11. In the light receiving region 13A, a plurality of light receiving elements are arranged in a matrix. The light receiving surface of the image sensor IC 13 is provided with terminal electrodes 13B in a region surrounding the light receiving region 13A. The terminal electrodes 13B include metal bumps made of gold, for example.

A flat film member 18 is attached to the mounting portion 21 of the base member 17 to cover the one principal surface (inner bottom) of the recessed portion 21A. The flat film member 18 is preferably made of an epoxy substrate with an elastic modulus (e.g., 20 GPa) higher than an elastic modulus (e.g., 7 GPa) of the base member 17. The flat film member 18 is provided with mount electrodes 18A, via hole conductors 18B, and pad conductors 18C. An end portion of the flat film member 18 is embedded in the raised portion 21B over the entire outer periphery of the flat film member 18. The pad conductors 18C are disposed in the other principal surface of the flat film member 18. The via hole conductors 16B in the base member 17 are directly bonded to the pad conductors 18C. The via hole conductors 18B pass through the inside of the flat film member 18 to electrically connect the mount electrodes 18A and the pad conductors 18C. The mount electrodes 18A are disposed in one principal surface of the flat film member 18 to be exposed from the recessed portion 21A. The terminal electrodes 13B of the image sensor IC 13 are ultrasonically welded to the mount electrodes 18A. The mount electrodes 18A used here are laminated electrodes each plated with gold on the surface. Besides the epoxy substrate, the flat film member 18 may be defined by a Low Temperature Co-fired Ceramic substrate or an alumina substrate, a metal plate, or any other members with an elastic modulus higher than that of the base member 17.

In the camera module 10 of the present preferred embodiment, as described above, the image sensor IC 13 is mounted on the circuit board 11 with the flat film member 18 interposed therebetween, and the terminal electrodes (metal bumps) 13B of the image sensor IC 13 are ultrasonically welded to the mount electrodes 18A of the flat film member 18. The flat film member 18 has a higher elastic modulus than the base member 17. Therefore, even though the image sensor IC 13 is mounted on the circuit board 11 by an ultrasonic welding method, it is possible to reduce the amount of ultrasonic vibration transmitted from the image sensor IC 13 through the flat film member 18 to the base member 17 and absorbed in the base member 17, and possible to generate a large amount of frictional heat. Therefore, the image sensor IC 13 is able to be bonded to the circuit board 11 with a sufficient bonding strength. The ultrasonic vibration locally acts on the surface of the flat film member 18. Therefore, even when the flat film member 18 is thin and its overall stiffness is small, the amount of ultrasonic vibration transmitted from the flat film member 18 to the base member 17 and absorbed in the base member 17 is significantly reduced.

The end portion of the flat film member 18 is embedded in the raised portion 21B over the entire outer periphery of the flat film member 18. At the same time, the pad conductors 18C are directly bonded to the via hole conductors 16B in the base member 17. This allows the flat film member 18 to be bonded to the base member 17 with a sufficient bonding strength. Therefore, even if the circuit board 11 of the camera module 10 is bent, it is possible to reduce falling of the image sensor IC 13 and the flat film member 18 and also reduce the occurrence of poor contact in electrical connection between the wiring portion 16 and the image sensor IC 13.

With reference to a method for manufacturing the camera module 10, the bonding of the image sensor IC 13 to the circuit board 11 will be described in detail.

FIGS. 4A to 4D are lateral cross-sectional views illustrating a non-limiting example of a process of manufacturing the camera module 10.

Figure 4A:
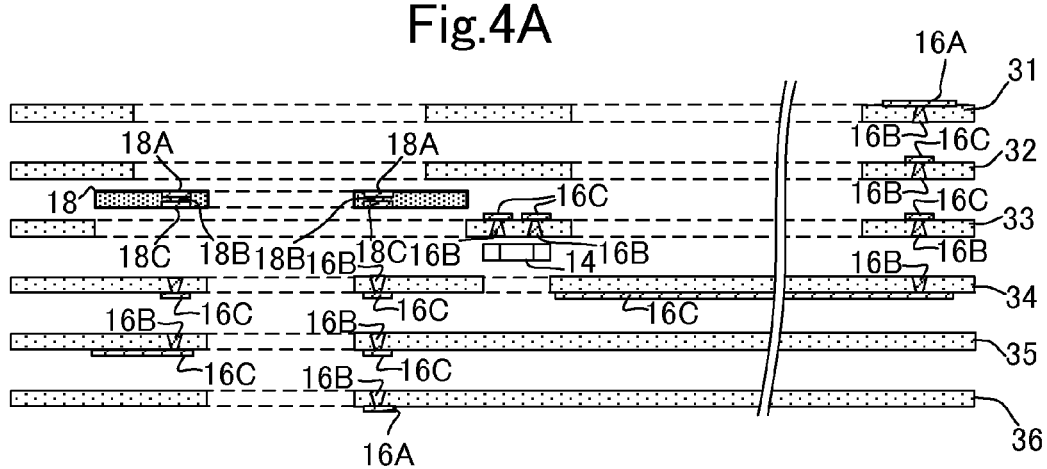
FIGS. 4A to 4D are lateral cross-sectional views illustrating a process of manufacturing the electronic component according to the first preferred embodiment of the present invention.

FIG. 4A is a lateral cross-sectional view illustrating a first step of the process. The first step is a step of forming each of the resin layers 31 to 36 in a single layer state.

Specifically, the first step first involves preparing a plurality of liquid crystal polymer resin sheets which are thermoplastic and are metal-coated on one side. The liquid crystal polymer resin sheets form the respective resin layers 31 to 36. A sheet of copper foil is typically used as a metal coating on such a liquid crystal polymer resin sheet. An epoxy substrate which is to form the flat film member 18 is also prepared. The flat film member 18 is provided with the mount electrodes 18A, the via hole conductors 18B, and the pad conductors 18C. The mount electrodes 18A preferably are gold-plated, for example. The flat film member 18 has through holes corresponding to the positions of the through hole 21C and the through holes 24 of the base member 17.

The liquid crystal polymer resin sheets are patterned using techniques of photolithography and etching to form the mount electrodes 16A and a conductive pattern corresponding to the inner conductive traces 16C. Holes are formed in each of the liquid crystal polymer resin sheets, and are then filled with a conductive paste which is to form the via hole conductors 16B. Preferably, the conductive paste is one that contains an alloy containing tin or silver as a main component and a binder. The cavity space 21D, the through hole 21C, the through holes 24, and component holding spaces for holding the end portion of the flat film member 18 and the circuit element 14 are formed in the liquid crystal polymer resin sheets by die-cutting. This step is performed in a multi-sheet state where a plurality of regions which are to be a plurality of circuit boards 11 are arranged.

Figure 4B:
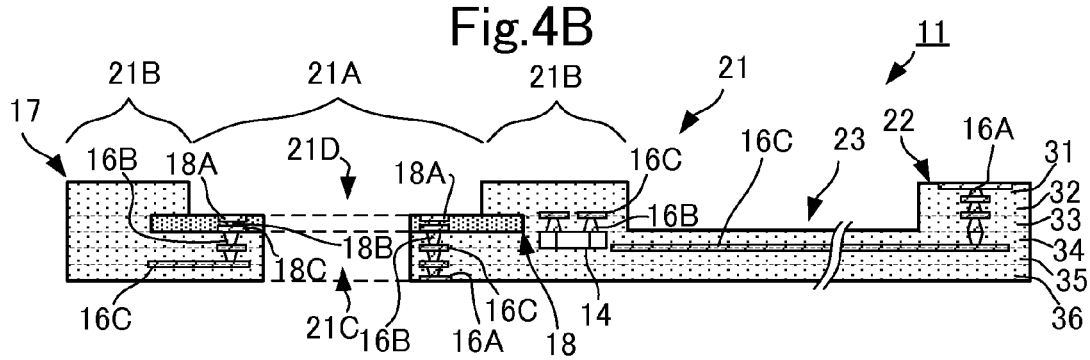

FIG. 4B is a cross-sectional view illustrating a second step following the first step. The second step is a step (circuit board forming step) of forming the circuit board 11.

Specifically, the second step first involves stacking the liquid crystal polymer resin sheets having the patterned metal coatings and openings, with the end portion of the flat film member 18 and the circuit element 14 positioned in the respective component holding spaces. Next, the stacked liquid crystal polymer resin sheets are bonded together by applying heat and pressure thereto. Since a liquid crystal polymer resin which is a thermoplastic resin is used here, the liquid crystal polymer resin sheets are able to be combined together to form the circuit board 11 without using bonding sheets or adhesive layers, such as prepreg layers. In the thermal pressure bonding here, the conductive paste described above is metalized (sintered) to form the via hole conductors 16B. Since the flat film member 18 and the base member 17 are made of different materials, the bonding strength at the contact surfaces of the flat film member 18 and the base member 17 is not significantly increased by bonding them together by applying heat and pressure thereto. However, as described above, the via hole conductors 16B in the base member 17 are directly bonded to the pad conductors 18C of the flat film member 18, and also the end portion of the flat film member 18 is embedded in the raised portion 21B. This allows the flat film member 18 and the base member 17 to be bonded together with a sufficient bonding strength. This step is also performed in a multi-sheet state where a plurality of regions which are to be the plurality of circuit boards 11 are arranged.

Figure 4C:
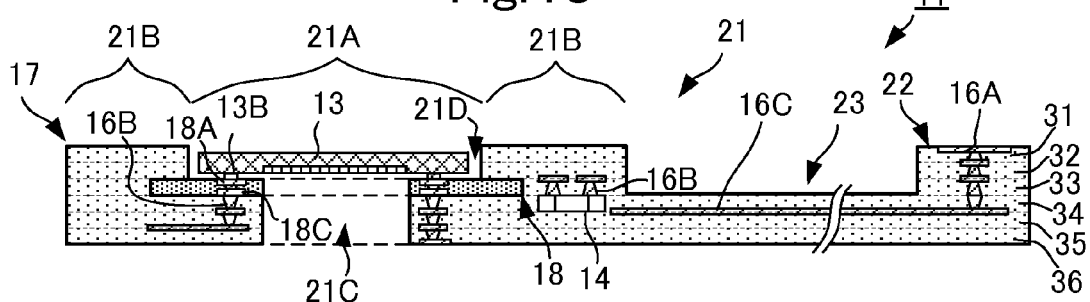

FIG. 4C is a cross-sectional view illustrating a third step following the second step. The third step is a step (ultrasonic welding step) of mounting the image sensor IC 13 on each of the circuit boards 11 in a multi-sheet state using an ultrasonic welding method.

Specifically, the third step involves generating frictional heat by ultrasonically vibrating the image sensor IC 13, with the image sensor IC 13 being in contact with the circuit board 11. Thus, the terminal electrodes 13B of the image sensor IC 13 and the mount electrodes 18A of the flat film member 18 are melted, and the gold of the terminal electrodes 13B is welded to (alloyed with) the gold on the mount electrodes 18A, so that the terminal electrodes 13B and the mount electrodes 18A are bonded together. As described above, the flat film member 18 has a higher elastic modulus than the base member 17. Therefore, when the image sensor IC 13 is mounted on the circuit board 11 with the flat film member 18 interposed therebetween, it is possible to reduce the amount of ultrasonic vibration transmitted from the image sensor IC 13 through the flat film member 18 to the base member 17 and absorbed in the base member 17, so that the image sensor IC 13 is mounted on the circuit board 11 with a sufficient bonding strength. Additionally, the base member 17 made of a thermoplastic resin is prevented from softening and caving in by frictional heat. A load applied to the image sensor IC 13 is able to be supported by the flat film member 18, and this stabilizes the bonding strength between the image sensor IC 13 and the circuit board 11. Also, even when the base member 17 made of a liquid crystal polymer resin has a crystal orientation, the image sensor IC 13 is able to be bonded without being affected by the crystal orientation. It is thus possible to stabilize the bonding strength of the image sensor IC 13 and simplify the mounting step.

Figure 4D:
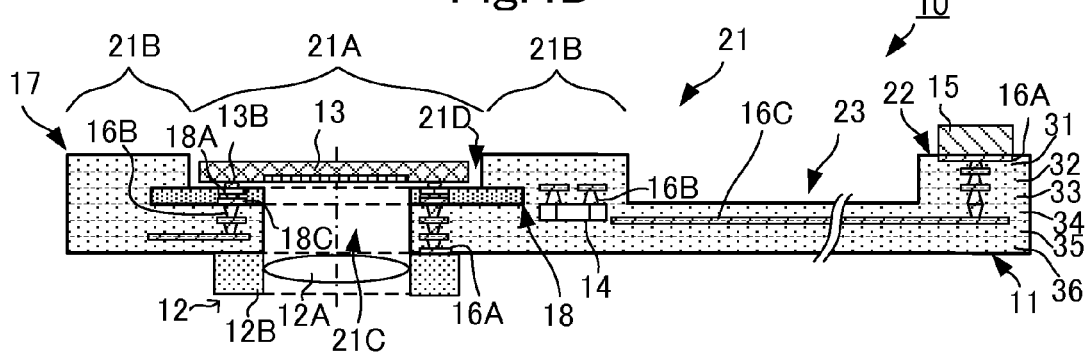

FIG. 4D is a cross-sectional view illustrating a fourth step following the third step. The fourth step is a step of mounting the lens unit 12 and the connector 15 on each of the circuit boards 11 in a multi-sheet state.

Specifically, the fourth step involves mounting the lens unit 12 and the connector 15 on each of the circuit boards 11 via a mounting method using solder. Then, the circuit boards 11 are cut into individual units to obtain a plurality of camera modules 10.

As described above, in the process of manufacturing the camera module 10 of the present preferred embodiment, the third step (ultrasonic welding step) involves ultrasonically welding the terminal electrodes 13B of the image sensor IC 13 to the mount electrodes 18A of the flat film member 18. It is thus possible to stably achieve a sufficient bonding strength. For example, even if the circuit board 11 is bent, the image sensor IC 13 does not easily fall off the base member 17.

In the second step (circuit board forming step), the via hole conductors 16B in the base member 17 are directly bonded to the pad conductors 18C of the flat film member 18. Therefore, as compared to the case in which the base member 17 is also provided with pad conductors which are bonded to the pad conductors 18C of the flat film member 18, the manufacturing process is simplified as there is no need to perform the step of providing the pad conductors for the base member 17.

As described above, the terminal electrodes 13B of the image sensor IC 13 are ultrasonically welded to the mount electrodes 18A of the flat film member 18. Since only the mount electrodes 18A of the flat film member 18 need to be gold-plated and there is no need to apply gold plating to the base member 17, the area of electrodes to be gold-plated is significantly reduced.

In the camera module 10 of the present preferred embodiment, the image sensor IC 13 is bonded to the circuit board 11 with a sufficient bonding strength. Additionally, the image sensor IC 13 is mounted on the circuit board 11 with high positional accuracy and in accurate parallelism with the surface of the circuit board 11. Therefore, it is possible to prevent entry of undesired light from the outside, prevent variation in the angle of incidence of incident light from the light path, and improve optical characteristics.

The lens unit 12 is disposed on the other principal surface of the mounting portion 21, whereas the image sensor IC 13 is disposed in the cavity space 21D on one principal surface side of the mounting portion 21. Therefore, it is possible to minimize the thickness of the mounting portion 21 while keeping a necessary distance between the lens unit 12 and the image sensor IC 13.

Figure 8:
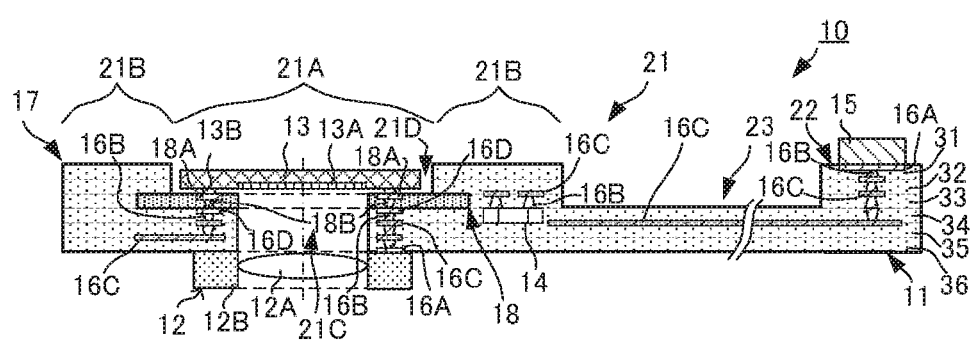
FIG. 8 is a lateral cross-sectional view of the electronic component according to another preferred embodiment of the present invention.

Although the pad conductors 18C of the flat film member 18 are directly bonded to the via hole conductors 16B in the base member 17 in the present preferred embodiment, the via hole conductors 18B of the flat film member 18 may be directly bonded to pad conductors 16D provided in the base member 17, as illustrated in FIG. 8.

A camera module according to a second preferred embodiment of the present invention will now be described.

Figure 5:
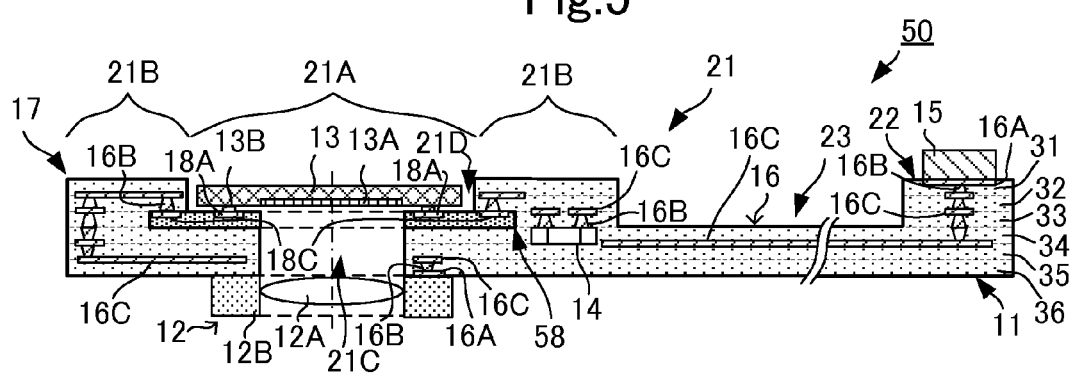
FIG. 5 is a lateral cross-sectional view of an electronic component according to a second preferred embodiment of the present invention.

FIG. 5 is a lateral cross-sectional view of a camera module 50 according to the second preferred embodiment.

The present preferred embodiment differs from the first preferred embodiment mainly in terms of the wiring structure of the flat film member. Specifically, a flat film member 58 has no via hole conductors, and is provided with a conductive pattern including the pad conductors 18C and the mount electrodes 18A only on one principal surface side. The pad conductors 18C and the mount electrodes 18A are connected to each other by a wiring pattern (not shown). The pad conductors 18C are disposed at an end portion of the flat film member 58, embedded in the raised portion 21B, and directly bonded to the via hole conductors 16B in the base member 17.

The camera module 50 is easily manufactured because it has a simple configuration where the flat film member 58 has no via hole conductors. The image sensor IC 13 is mounted on the circuit board 11 with the flat film member 58 interposed therebetween, and the terminal electrodes 13B of the image sensor IC 13 are ultrasonically welded to the mount electrodes 18A of the flat film member 58. Thus, the image sensor IC 13 is bonded to the circuit board 11 with a sufficient bonding strength. For example, even if the circuit board 11 is bent, it is possible to prevent the image sensor IC 13 from easily falling off, and to significantly reduce or prevent the occurrence of poor contact in electrical connection between the wiring portion 16 and the image sensor IC 13.

Although the via hole conductors 16B in the base member 17 are directly bonded to the pad conductors 18C of the flat film member 58 in the present preferred embodiment, the inner conductive traces 16C in the base member 17 may be bonded to the pad conductors 18C. A wiring connection through the via hole conductors 18B described in the first preferred embodiment may be added to the configuration of the second preferred embodiment.

Camera modules according to other preferred embodiments of the present invention will now be described.

Figure 6A:
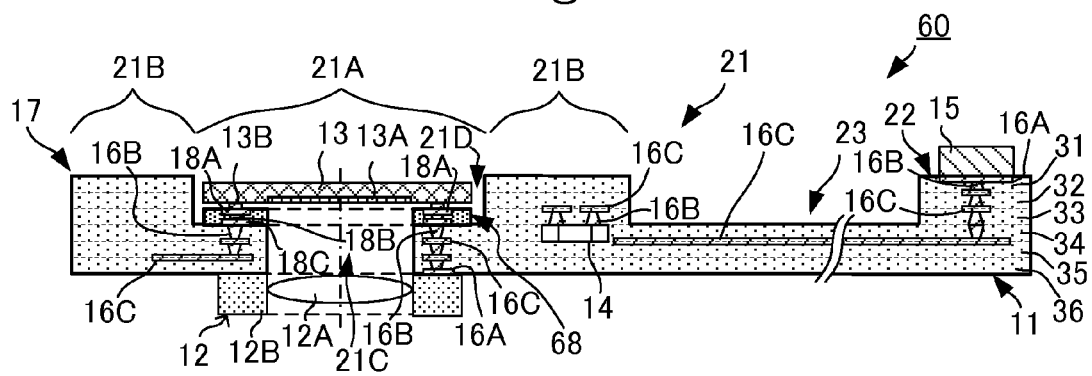
FIGS. 6A to 6C are lateral cross-sectional views of electronic components according to other preferred embodiments of the present invention.

FIG. 6A is a lateral cross-sectional view of a camera module 60 according to a third preferred embodiment of the present invention.

The present preferred embodiment differs from the first preferred embodiment mainly in that the end portion of the flat film member is not embedded in the raised portion 21B. A flat film member 68 is provided with the mount electrodes 18A in one principal surface, the via hole conductors 18B inside, and the pad conductors 18C in the other principal surface. The via hole conductors 16B in the base member 17 are directly bonded to the pad conductors 18C, and this allows the flat film member 68 to be bonded to the base member 17. Thus, the flat film member does not necessarily need to be embedded in the raised portion 21B. Instead, after the step of forming the base member 17 as a laminated member, the flat film member 68 may be mounted on and bonded to the base member 17 with an adhesive or the like. In this case, the base member 17 may be provided with pad conductors, which are bonded to pad conductors of the flat film member 68.

Figure 6B:
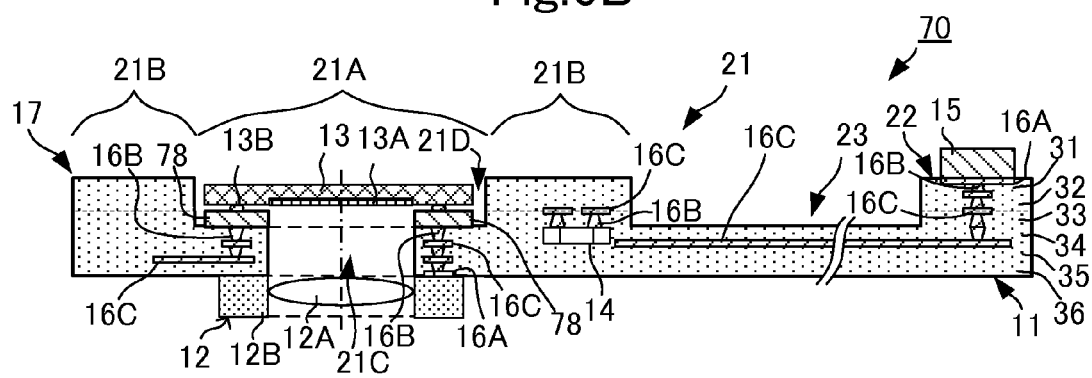

FIG. 6B is a lateral cross-sectional view of a camera module 70 according to a fourth preferred embodiment of the present invention.

The present preferred embodiment differs from the first preferred embodiment mainly in that the flat film member is formed by a metal plate. A plurality of flat film members 78 are provided for the respective terminal electrodes 13B of the image sensor IC 13. The flat film members 78 are configured as separate members.

The flat film members 78 are easily formed in the camera module 70. Additionally, the image sensor IC 13 is mounted on the circuit board 11 with the flat film members 78 interposed therebetween, and the terminal electrodes 13B of the image sensor IC 13 are ultrasonically welded to the flat film members 78. Therefore, the image sensor IC 13 is bonded to the circuit board 11 with a sufficient bonding strength. For example, even if the circuit board 11 is bent, it is possible to prevent the image sensor IC 13 from easily falling off, and to significantly reduce or prevent the occurrence of poor contact in electrical connection between the wiring portion 16 and the image sensor IC 13.

Besides being defined by a metal plate, the flat film members 78 may be obtained by providing a thick plating layer made of a metal with a high elastic modulus on electrodes provided on the circuit board 11. For example, the flat film members 78 may be formed by plating copper (Cu) electrodes on the circuit board 11 with nickel (Ni) having a higher elastic modulus than Cu. This achieves the same effect as that achieved when the flat film members 78 are defined by a metal plate. When the flat film members 78 are formed by Ni plating, it is desirable that the Ni surface be further plated with gold (Au) to enhance bondability of ultrasonic welding. It takes time to increase the thickness of the flat film members 78 only by Ni plating. However, if the Ni plating process is followed by the Au plating process, the thickness of the plating is able to be increased in a shorter period of plating process time.

Figure 6C:
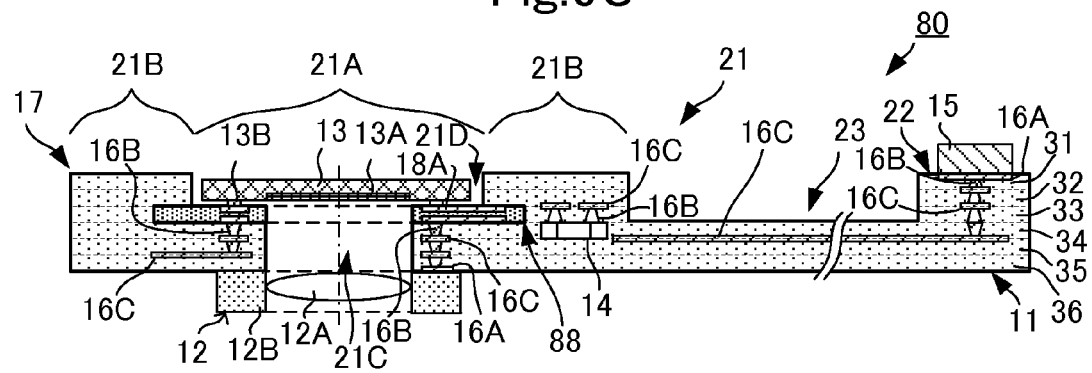
Figure 7:
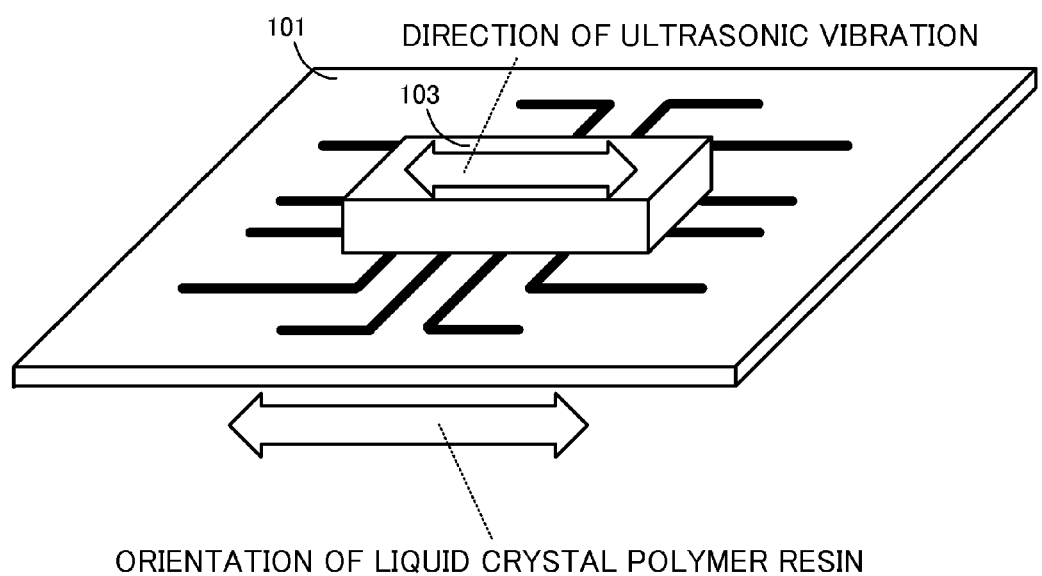
FIG. 7 is a perspective view of an electronic component of related art.

FIG. 6C is a lateral cross-sectional view of a camera module 80 according to a fifth preferred embodiment of the present invention.

The present preferred embodiment differs from the first preferred embodiment mainly in that the dielectric constant, dielectric loss, magnetic permeability, or the like of the flat film member differs from that of the base member 17, and that the flat film member is provided with a functional conductor defining a high-frequency component or a magnetic component. Here, a flat film member 88 is defined by a Low Temperature Co-fired Ceramics substrate having a dielectric constant (e.g., 5 to 10 F/m) higher than a dielectric constant (e.g., 1 to 3 F/m) of the base member 17, and portions of the mount electrodes 18A and the pad conductors 18C also define a functional conductor (capacitor electrode) forming a high-frequency component (capacitor). This makes the area of the functional conductor (capacitor electrode) smaller than that when the functional conductor (capacitor electrode) is provided in the base member 17. The flat film member 88 may be made of a magnetic material and provided with a functional conductor (e.g., coil pattern) also defining a magnetic component.

The present invention can be implemented in various preferred embodiments as described above. However, the electronic components of the present invention are not limited to camera modules and may be other electronic components. The material of the circuit board is not limited to a liquid crystal polymer resin or a thermoplastic resin, and may be other flexible materials.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a surface mount element including a terminal electrode; and
   a circuit board on which the surface mount element is mounted; wherein
   the circuit board includes:
      a flat film member including a mount electrode ultrasonically welded to the terminal electrode;
      a base member to which the flat film member is bonded;
      a via hole conductor provided in one of the base member and the flat film member; and
      a pad conductor provided at the other of the base member and the flat film member;
   an elastic modulus of the flat film member is higher than an elastic modulus of the base member;
   the via hole conductor is directly bonded to the pad conductor, and the mount electrode is electrically connected to the base member through the via hole conductor and the pad conductor;
   the flat film member includes an insulating member in contact with the mount electrode; and
   the flat film member has a dielectric constant different from that of the base member, and is provided with a functional conductor defining a high-frequency component.

2. An electronic component comprising:
   a surface mount element including a terminal electrode; and
   a circuit board on which the surface mount element is mounted; wherein
   the circuit board includes:
      a flat film member including a mount electrode ultrasonically welded to the terminal electrode;
      a base member to which the flat film member is bonded;
      a via hole conductor provided in one of the base member and the flat film member; and
      a pad conductor provided at the other of the base member and the flat film member;
   an elastic modulus of the flat film member is higher than an elastic modulus of the base member;

the via hole conductor is directly bonded to the pad conductor, and the mount electrode is electrically connected to the base member through the via hole conductor and the pad conductor;
the flat film member includes an insulating member in contact with the mount electrode; and
the flat film member has magnetic permeability different from that of the base member, and is provided with a functional conductor defining a magnetic component.

3. An electronic component comprising:
a surface mount element including a terminal electrode; and
a circuit board on which the surface mount element is mounted; wherein
the circuit board includes:
   a flat film member including a mount electrode ultrasonically welded to the terminal electrode; and
   a base member to which the flat film member is bonded;
an elastic modulus of the flat film member is higher than an elastic modulus of the base member;
the base member includes a recessed portion and a raised portion in one principal surface thereof; and
an end portion of the flat film member is embedded in the raised portion.

4. The electronic component according to claim 3, wherein the surface mount element is contained in the recessed portion.

5. The electronic component according to claim 3, wherein the flat film member includes a pad conductor in a surface thereof where the mount electrode is provided, the pad conductor is embedded in the raised portion, and the mount electrode is electrically connected to the base member through the pad conductor.

6. The electronic component according to claim 3, wherein the flat film member has a dielectric constant different from that of the base member, and is provided with a functional conductor defining a high-frequency component.

7. The electronic component according to claim 3, wherein the flat film member has magnetic permeability different from that of the base member, and is provided with a functional conductor defining a magnetic component.

8. The electronic component according to claim 3, wherein
the surface mount element is an image sensor integrated circuit; and
the electronic component defines a camera module including the image sensor integrated circuit and a lens unit optically connected to the image sensor integrated circuit.

9. A method for manufacturing the electronic component according to claim 3, comprising:
placing the surface mount element on the flat film member included in the circuit board; and
ultrasonically welding the terminal electrode to the mount electrode.

10. A circuit board comprising:
a flat film member including a mount electrode;
a base member to which the flat film member is bonded;
a via hole conductor provided in one of the base member and the flat film member; and
a pad conductor provided at the other of the base member and the flat film member; wherein
an elastic modulus of the flat film member is higher than an elastic modulus of the base member;
the via hole conductor is directly bonded to the pad conductor, and the mount electrode is electrically connected to the base member through the via hole conductor and the pad conductor;
the flat film member includes an insulating member in contact with the mount electrode;
the base member includes a recessed portion and a raised portion in one principal surface thereof; and
an end portion of the flat film member is embedded in the raised portion, and the mount electrode is exposed from a portion of the flat film member provided at the recessed portion.

11. The circuit board according to claim 10, wherein the flat film member includes the pad conductor in a surface thereof where the mount electrode is provided, the pad conductor is embedded in the raised portion, and the mount electrode is electrically connected to the base member through the pad conductor.

12. A circuit board comprising:
a flat film member including a mount electrode;
a base member to which the flat film member is bonded;
a via hole conductor provided in one of the base member and the flat film member; and
a pad conductor provided at the other of the base member and the flat film member; wherein
an elastic modulus of the flat film member is higher than an elastic modulus of the base member;
the via hole conductor is directly bonded to the pad conductor, and the mount electrode is electrically connected to the base member through the via hole conductor and the pad conductor;
the flat film member includes an insulating member in contact with the mount electrode; and
the flat film member has a dielectric constant different from that of the base member, and is provided with a functional conductor defining a high-frequency component.

13. A circuit board comprising:
a flat film member including a mount electrode;
a base member to which the flat film member is bonded;
a via hole conductor provided in one of the base member and the flat film member; and
a pad conductor provided at the other of the base member and the flat film member; wherein
an elastic modulus of the flat film member is higher than an elastic modulus of the base member;
the via hole conductor is directly bonded to the pad conductor, and the mount electrode is electrically connected to the base member through the via hole conductor and the pad conductor;
the flat film member includes an insulating member in contact with the mount electrode; and
the flat film member has magnetic permeability different from that of the base member, and is provided with a functional conductor defining a magnetic component.

* * * * *